US010578276B2

(12) United States Patent
Marquardt et al.

(10) Patent No.: US 10,578,276 B2
(45) Date of Patent: Mar. 3, 2020

(54) OPTIC FOR A LIGHT SOURCE

(71) Applicant: ABL IP Holding LLC, Decatur, GA (US)

(72) Inventors: Craig Eugene Marquardt, Covington, GA (US); Jie Chen, Snellville, GA (US); Daniel Aaron Weiss, Tucker, GA (US)

(73) Assignee: ABL IP Holding LLC, Atlanta, GA (US)

( * ) Notice: Subject to any disclaimer, the term of this patent is extended or adjusted under 35 U.S.C. 154(b) by 136 days.

(21) Appl. No.: 15/266,738

(22) Filed: Sep. 15, 2016

(65) Prior Publication Data

US 2017/0002998 A1 Jan. 5, 2017

Related U.S. Application Data

(63) Continuation of application No. 13/834,599, filed on Mar. 15, 2013, now Pat. No. 9,470,395.

(51) Int. Cl.
*F21V 5/04* (2006.01)
*H05K 3/28* (2006.01)
(Continued)

(52) U.S. Cl.
CPC ........ *F21V 5/048* (2013.01); *B29D 11/00807* (2013.01); *F21V 5/008* (2013.01); *F21V 5/04* (2013.01); *F21V 7/22* (2013.01); *F21V 13/04* (2013.01); *F21V 19/002* (2013.01); *F21V 23/005* (2013.01); *H05K 1/0274* (2013.01); *H05K 1/181* (2013.01); *H05K 3/284* (2013.01); *B29K 2083/00* (2013.01); *B29K 2105/253* (2013.01); *F21V 5/007* (2013.01); *F21Y 2101/00* (2013.01); *F21Y 2115/10* (2016.08);
(Continued)

(58) Field of Classification Search
CPC .............. B29D 11/00807; B29D 25/00; B29D 11/00–0099; H05K 1/0274; H05K 3/284; H01L 33/58; F21V 5/048
See application file for complete search history.

(56) References Cited

U.S. PATENT DOCUMENTS 4,935,665 A    6/1990   Murata
5,903,212 A *   5/1999   Rodgers ............. H05B 33/0845
                                                   340/309.3
(Continued)

FOREIGN PATENT DOCUMENTS

EP       2484956     8/2012
JP     2010110894    5/2010
(Continued)

OTHER PUBLICATIONS

Extended European Search Report for European Patent Application No. 14159879.7, dated Jul. 10, 2014, 6 pages.
(Continued)

*Primary Examiner* — Alex A Rolland
(74) *Attorney, Agent, or Firm* — Kilpatrick Townsend & Stockton LLP (57) ABSTRACT

Optics over a light source, such as, but not limited to, an LED on a circuit board. The optic does not entirely encapsulate the LED but rather includes an inner surface such that an air gap exists between the optic and the LED. The optic may include a lens and may conform to the shape of the circuit board.

22 Claims, 6 Drawing Sheets

(51) Int. Cl.

| | | |
|---|---|---|
| *F21V 23/00* | (2015.01) | |
| *H05K 1/02* | (2006.01) | |
| *F21V 13/04* | (2006.01) | |
| *B29D 11/00* | (2006.01) | |
| *F21V 5/00* | (2018.01) | |
| *F21V 7/22* | (2018.01) | |
| *F21V 19/00* | (2006.01) | |
| *H05K 1/18* | (2006.01) | |
| *F21Y 101/00* | (2016.01) | |
| *F21Y 115/10* | (2016.01) | |
| *B29K 83/00* | (2006.01) | |
| *B29K 105/00* | (2006.01) | |

(52) U.S. Cl.
CPC ............ *H05K 2201/0162* (2013.01); *H05K 2201/10106* (2013.01); *H05K 2203/1327* (2013.01); *Y10T 29/49124* (2015.01)

(56) References Cited

U.S. PATENT DOCUMENTS

| | | | |
|---|---|---|---|
| 5,958,176 | A | 9/1999 | Isshiki et al. |
| 6,040,395 | A | 3/2000 | Isshiki et al. |
| 6,179,436 | B1 | 1/2001 | Gitkind |
| 6,188,527 | B1 | 2/2001 | Bohn |
| 6,235,862 | B1 | 5/2001 | Isshiki et al. |
| 6,518,204 | B2 | 2/2003 | Yamakawa et al. |
| 6,997,575 | B2 | 2/2006 | Sommers |
| 7,040,779 | B2 | 5/2006 | Lamke et al. |
| 7,259,403 | B2 | 8/2007 | Shimizu et al. |
| 7,273,300 | B2 | 9/2007 | Mrakovich |
| 7,344,902 | B2 | 3/2008 | Basin et al. |
| 7,352,011 | B2 | 4/2008 | Smits et al. |
| 7,355,284 | B2 | 4/2008 | Negley |
| 7,400,439 | B2 | 7/2008 | Holman |
| 7,452,737 | B2 | 11/2008 | Basin et al. |
| 7,496,270 | B2 | 2/2009 | Kim et al. |
| 7,625,986 | B2 | 12/2009 | Yoshitake et al. |
| 7,651,887 | B2 | 1/2010 | Morita et al. |
| 7,651,958 | B2 | 1/2010 | Morita et al. |
| 7,709,853 | B2 | 5/2010 | Medendorp, Jr. |
| 7,748,872 | B2 | 7/2010 | Holder et al. |
| 7,763,478 | B2 | 7/2010 | Loh et al. |
| 7,763,697 | B2 | 7/2010 | Kato et al. |
| 7,828,453 | B2 | 11/2010 | Tran et al. |
| 7,850,341 | B2 | 12/2010 | Mrakovich et al. |
| 7,857,497 | B2 | 12/2010 | Koike et al. |
| 7,858,408 | B2 | 12/2010 | Mueller et al. |
| 7,858,998 | B2 | 12/2010 | Negley |
| 7,863,392 | B2 | 1/2011 | Nakanishi et al. |
| 7,918,590 | B1 | 4/2011 | Li et al. |
| 7,990,033 | B2 | 8/2011 | Nakata et al. |
| 8,002,435 | B2 | 8/2011 | Laporte |
| 8,070,329 | B1 | 12/2011 | Bechtel et al. |
| 8,071,697 | B2 | 12/2011 | Frisch et al. |
| 8,147,742 | B2 | 4/2012 | Chen et al. |
| 8,163,580 | B2 | 4/2012 | Daschner et al. |
| 8,217,412 | B2 | 7/2012 | Yuan et al. |
| 8,258,502 | B2 | 9/2012 | Yoshitake et al. |
| 8,262,970 | B2 | 9/2012 | Morita et al. |
| 8,267,553 | B2 | 9/2012 | Liang et al. |
| 8,269,240 | B2 | 9/2012 | Negley |
| 8,287,150 | B2 | 10/2012 | Schaefer et al. |
| 8,293,548 | B2 | 10/2012 | Cheng et al. |
| 8,963,188 | B2 | 2/2015 | Park |
| 2005/0052737 | A1 | 3/2005 | Amemiya et al. |
| 2005/0259424 | A1 | 11/2005 | Zampini II, et al. |
| 2006/0097385 | A1 | 5/2006 | Negley |
| 2006/0105485 | A1* | 5/2006 | Basin .................... H01L 24/97 438/27 |
| 2007/0012940 | A1 | 1/2007 | Suh et al. |
| 2007/0029569 | A1 | 2/2007 | Andrews |
| 2007/0121326 | A1 | 5/2007 | Nall et al. |
| 2007/0269747 | A1 | 11/2007 | Bahadur et al. |
| 2008/0033843 | A1 | 2/2008 | Warton et al. |
| 2008/0157114 | A1 | 7/2008 | Basin et al. |
| 2008/0170396 | A1 | 7/2008 | Yuan et al. |
| 2008/0174997 | A1 | 7/2008 | Zampini et al. |
| 2008/0185601 | A1 | 8/2008 | Frisch et al. |
| 2008/0193749 | A1 | 8/2008 | Thompson et al. |
| 2008/0273327 | A1 | 11/2008 | Wilcox et al. |
| 2009/0050907 | A1* | 2/2009 | Yuan .................. H05B 33/0821 257/88 |
| 2009/0146175 | A1 | 6/2009 | Bahadur et al. |
| 2009/0225543 | A1 | 9/2009 | Jacobson et al. |
| 2009/0323330 | A1 | 12/2009 | Gordin et al. |
| 2010/0060157 | A1 | 3/2010 | Shi |
| 2010/0065983 | A1* | 3/2010 | Kawakubo ............ B29C 43/021 264/272.14 |
| 2010/0128474 | A1 | 5/2010 | Chen et al. |
| 2010/0195326 | A1 | 8/2010 | Boxler et al. |
| 2010/0232133 | A1* | 9/2010 | Tran ................. B29D 11/00634 362/84 |
| 2011/0007513 | A1 | 1/2011 | Zhang et al. |
| 2011/0031516 | A1* | 2/2011 | Basin .................... H01L 33/507 257/98 |
| 2011/0057205 | A1 | 3/2011 | Mueller et al. |
| 2011/0068356 | A1 | 3/2011 | Chiang et al. |
| 2011/0103051 | A1 | 5/2011 | Wilcox et al. |
| 2011/0157891 | A1 | 6/2011 | Davis et al. |
| 2011/0194281 | A1 | 8/2011 | Josefowicz et al. |
| 2011/0216538 | A1 | 9/2011 | Logan et al. |
| 2011/0227235 | A1 | 9/2011 | Yoshitake et al. |
| 2011/0242807 | A1 | 10/2011 | Little, Jr. et al. |
| 2011/0254047 | A1 | 10/2011 | Yoshitake et al. |
| 2011/0272722 | A1 | 11/2011 | Chen |
| 2011/0280014 | A1 | 11/2011 | Householder et al. |
| 2011/0320998 | A1 | 12/2011 | Perry et al. |
| 2012/0001208 | A1 | 1/2012 | Brick et al. |
| 2012/0061716 | A1 | 3/2012 | Yu et al. |
| 2012/0065343 | A1 | 3/2012 | Bahadur et al. |
| 2012/0074450 | A1 | 3/2012 | Sakurai et al. |
| 2012/0120654 | A1 | 5/2012 | Kobayashi et al. |
| 2012/0125436 | A1 | 5/2012 | Cummings et al. |
| 2012/0165451 | A1 | 6/2012 | Igarashi et al. |
| 2012/0182739 | A1 | 7/2012 | Leung et al. |
| 2012/0199995 | A1 | 8/2012 | Pugh et al. |
| 2012/0235180 | A1 | 9/2012 | Medendorp, Jr. |
| 2012/0250309 | A1 | 10/2012 | Handsaker |
| 2012/0267650 | A1 | 10/2012 | Schubert et al. |
| 2013/0134609 | A1 | 5/2013 | Yoshitake et al. |
| 2014/0268810 | A1 | 9/2014 | Marquardt et al. |

FOREIGN PATENT DOCUMENTS

| | | |
|---|---|---|
| JP | 2011138831 | 7/2011 |
| WO | 2004068596 | 8/2004 |

OTHER PUBLICATIONS

Non-Final Office Action for U.S. Appl. No. 13/834,599, dated Dec. 18, 2014, 14 pages.
Amendment for U.S. Appl. No. 13/834,599, filed Mar. 18, 2015, 16 pages.
Final Office Action for U.S. Appl. No. 13/834,599, dated Jul. 10, 2015, 16 pages.
Amendment under 37 CFR § 1.116 Expedited Procedure, filed Oct. 30, 2016, 13 pages.
Non-Final Office Action for U.S. Appl. No. 13/834,599, dated Dec. 3, 2015, 11 pages.
Amendment and Response to Non-Final Office Action for U.S. Appl. No. 13/834,599, filed Mar. 2, 2016, 8 pages.
Notice of Allowance for U.S. Appl. No. 13/834,599, dated Jun. 15, 2016, 8 pages.

\* cited by examiner

OPTIC FOR A LIGHT SOURCE

CROSS REFERENCE TO RELATED APPLICATION

This application is a continuation of U.S. patent application Ser. No. 13/834,599 (allowed) filed Mar. 15, 2013, entitled OPTIC FOR A LIGHT SOURCE, which is incorporated herein by reference in its entirety.

FIELD

Embodiments of the present invention relate to an optic for a light source, such as a light emitting diode.

BACKGROUND

Light emitting diodes ("LEDs") are typically mounted on a printed circuit board ("PCB") and wired to the PCB. Often a silicone or acrylic optic is deposited over the LED to encapsulate the LED such that no space exists between the optic and the LED. Encapsulation of the LED by the optic eliminates a surface that could otherwise be used to control the light distribution.

SUMMARY

Certain embodiments of the present invention provide an optic over a light source, such as, but not limited to, an LED, whereby the optic does not entirely encapsulate the LED but rather includes an inner surface such that an air gap exists between the optic and the LED.

The terms "invention," "the invention," "this invention" and "the present invention" used in this patent are intended to refer broadly to all of the subject matter of this patent and the patent claims below. Statements containing these terms should not be understood to limit the subject matter described herein or to limit the meaning or scope of the patent claims below. Embodiments of the invention covered by this patent are defined by the claims below, not this summary. This summary is a high-level overview of various aspects of the invention and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to the entire specification of this patent, all drawings and each claim.

BRIEF DESCRIPTION OF THE FIGURES

Illustrative embodiments of the present invention are described in detail below with reference to the following drawing figures.

DETAILED DESCRIPTION

The subject matter of embodiments of the present invention is described here with specificity to meet statutory requirements, but this description is not necessarily intended to limit the scope of the claims. The claimed subject matter may be embodied in other ways, ma include different elements or steps, and may be used in conjunction with other existing or future technologies. This description should not be interpreted as implying any particular order or arrangement among or between various steps or elements except when the order of individual steps or arrangement of elements is explicitly described.

Figure 1:
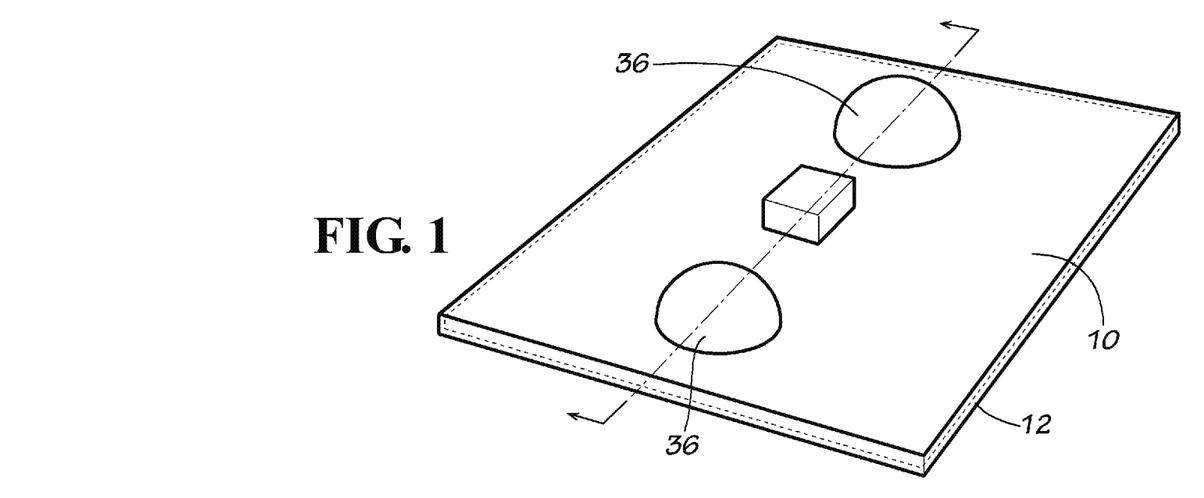
FIG. 1 is a top perspective view of an embodiment of an optic positioned on a PCB.
Figure 2:
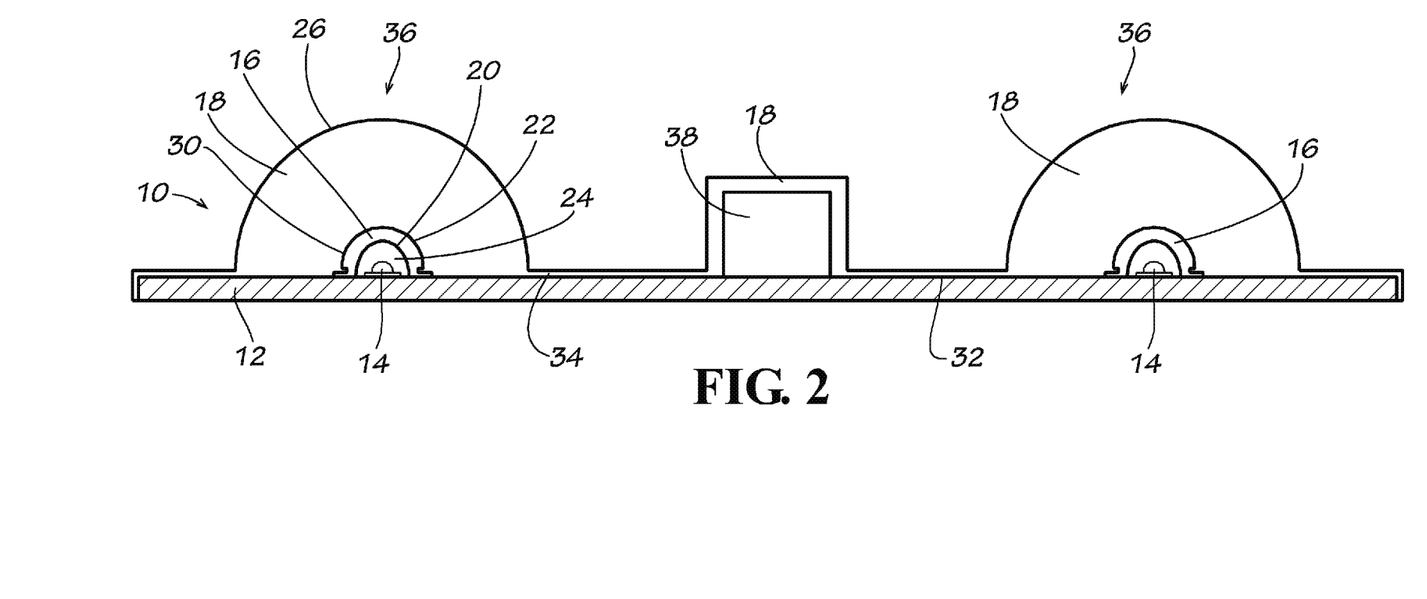
FIG. 2 is a cross-sectional view taken along line 2-2 in FIG. 1.

Embodiments of the present invention provide an optic over a light source, such as, but not limited to, an LED, whereby the optic does not entirely encapsulate the LED but rather includes an inner surface such that an air gap exists between the optic and the LED. FIGS. 1 and 2 illustrate an embodiment of an optic 10 contemplated herein provided on a. PCB 12 populated with LEDs 14. The PCB 12 can be of any shape or size and any number of LEDs 14 may be mounted on the PCB 12 in any orientation.

Figure 3:
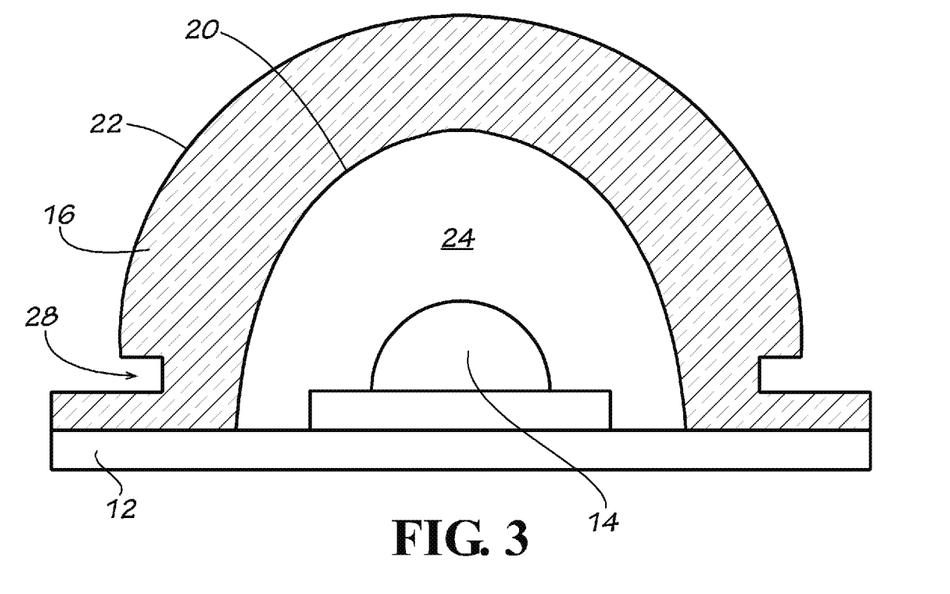
FIG. 3 is an isolated cross-sectional view of an embodiment of an inner optic positioned over an LED.

The optic 10 includes an inner optic 16 and an outer optic 18. In some embodiments, the inner optic 16 is pre-formed and includes an inner surface 20 and an outer surface 22. The inner surface 20 and outer surface 22 may be formed in any shape and with any surface enhancements to have the desired optical properties to effectuate the desired bending of the light emitted by the LED 14. The inner optic 16 is glued or bonded over the LED 14, such as with silicone or other optical adhesives. See FIG. 3. This seals the LED 14 within the inner optic 16. When so positioned, an air gap 24 exists between the LED 14 and the inner surface 20 of the inner optic 16.

The outer optic 18 is than molded directly over the inner optic 16 so as to have an outer surface 26. In some embodiments, an interlocking feature (such as key 28) may be, but does not have to be, provided on the inner optic 16 to enhance retention of the outer optic 18 on the inner optic 16. Provision of the outer optic 18 over the inner optic 16 serves to protect the outer surface of the inner optic 16 from dirt and debris.

The outer surface 26 of the outer optic 18 may be of an shape and with any surface enhancements to have the desired optical properties to effectuate the desired distribution of the light emitted by the LED 14.

Figure 4:
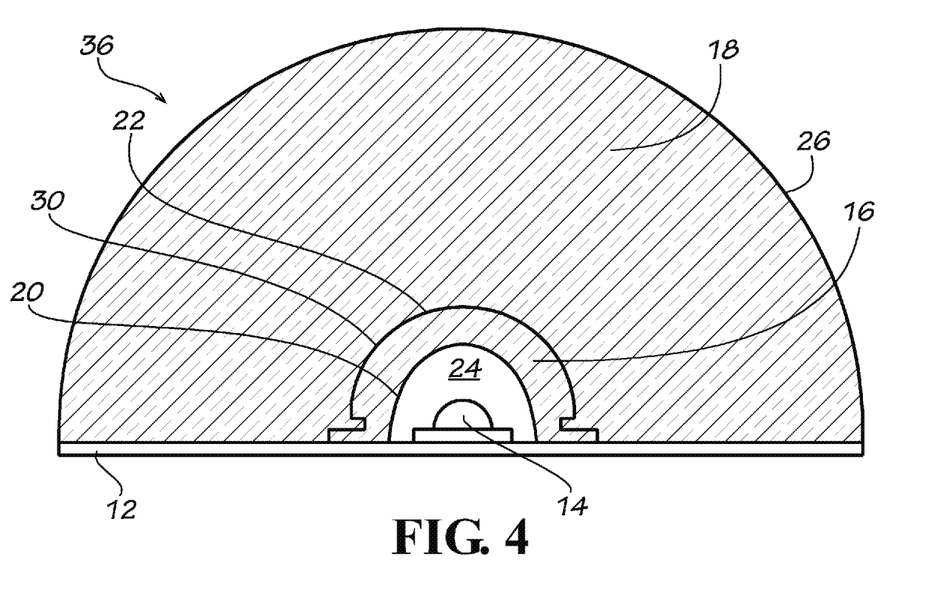
FIG. 4 is an isolated cross-sectional view of an embodiment of an outer optic positioned over the inner optic of FIG. 3.

In some embodiments (see FIG. 4), the inner optic 16 and outer optic 18 are formed of the identical material (including, but not limited to, silicone) such that the witness line 30 where the outer optic 18 encounters the outer surface 22 of the inner optic 16 is undetectable (although it is shown in FIG. 4 for purposes of illustration).

Figure 5:
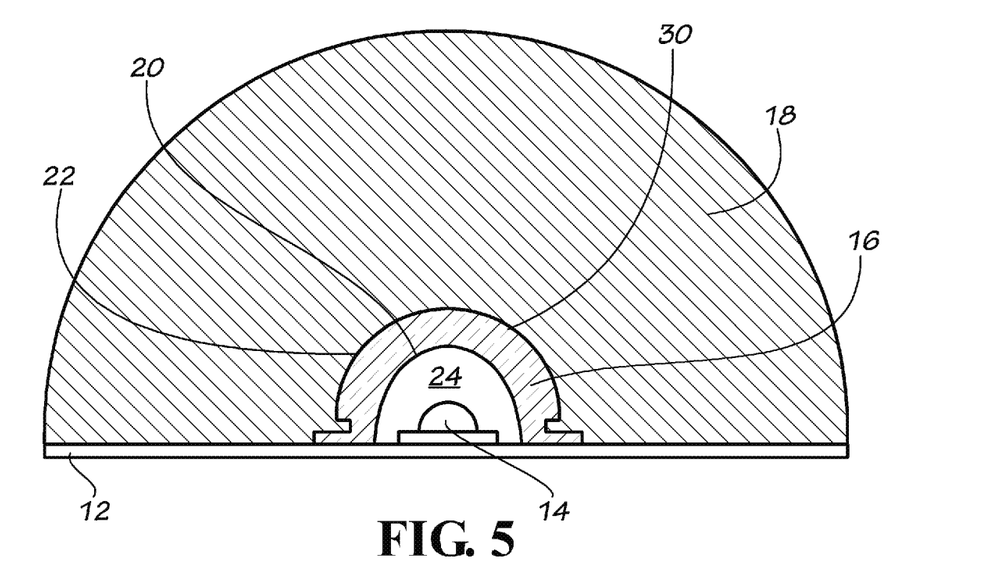
FIG. 5 is an isolated cross-sectional view of another embodiment of an outer optic positioned over the inner optic of FIG. 3.

However, in other embodiments (see FIG. 5), the materials used to form the inner optic 16 and outer optic 18 are not identical. By way only of example, the inner optic 16 could be formed of a silicone material different from the silicone material forming the outer optic 18. In such circumstances, the witness line 30 where the inner optic 16 and outer optic 18 meet is detectable and serves further to bend the emitted light. In such embodiments, the shape and optical properties of the outer surface 22 of the inner optic 16 impacts the light distribution. Moreover, in such embodiments, the inner optic 16 can bend or direct the emitted light at different angles than the outer optic 18.

Figure 6:
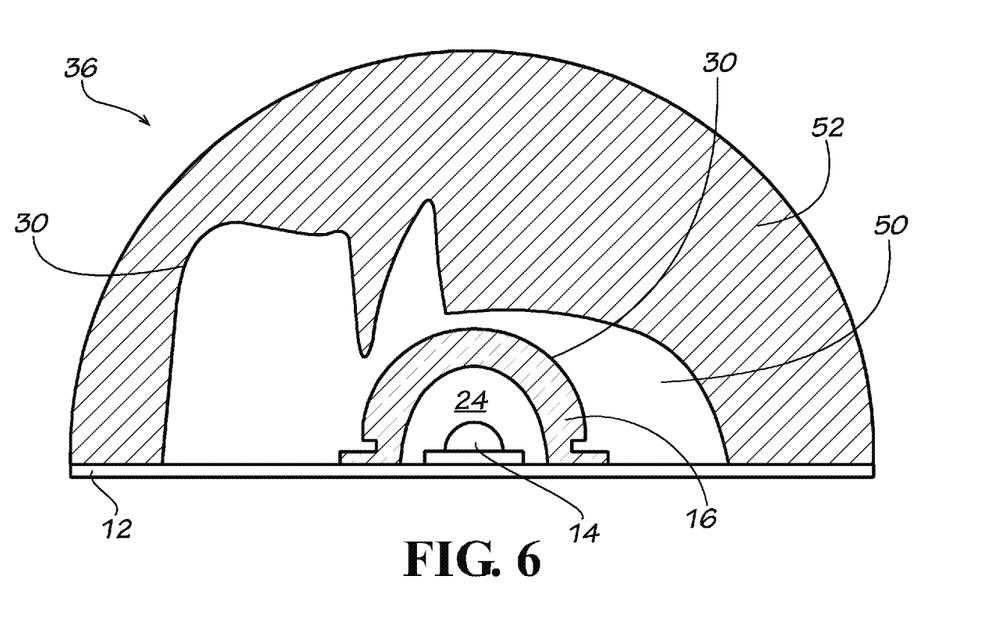
FIG. 6 is an isolated cross-sectional view of yet another embodiment of an outer optic positioned over the inner optic of FIG. 3.

It is possible to mold multiple outer optics 18 over the inner optic 16. For example, FIG. 6 illustrates a first outer optic 50 and a second outer optic 52 provided over inner optic 16. In some embodiments, the first outer optic 50 is formed of a material that is different from both the inner optic 16 and the second outer optic 52 so that multiple witness lines 30 (having any desired shape) are formed within the optic 10 for directing the emitted light as desired.

In some embodiments, the outer optic 18 is also molded directly onto the upper surface 34 of the PCB 12 such that the lower surface 32 of the optic 10 contacts the upper surface 34 of the PCB 12 but includes lenses 36 (the underside of which is defined by the inner surface 20 of the inner optic 16) positioned over the LEDs 14. See FIG. 2. The upper surface 34 of the PCB 12 between adjacent LEDs 14 is typically populated with electronic components (e.g., traces, resistors, etc.), represented schematically as electronic components 38, such that the upper surface 34 of the PCB 12 is not planar. The outer optic 18 may be molded directly onto the upper surface 34 of the PCB 12 and over such electronic components 38 so as to seal and protect the electronic components 38 on the PCB 12. In this way, the lower surface 32 of the optic 10 (more specifically the outer optic 18) conforms to the shape of such electronic components 38 on the PCB 12. Because the silicone cure temperature is lower than the solder paste and electronic equipment on the PCB 12, the disclosed molding process does no damage to such electronic components 38.

Figure 7:
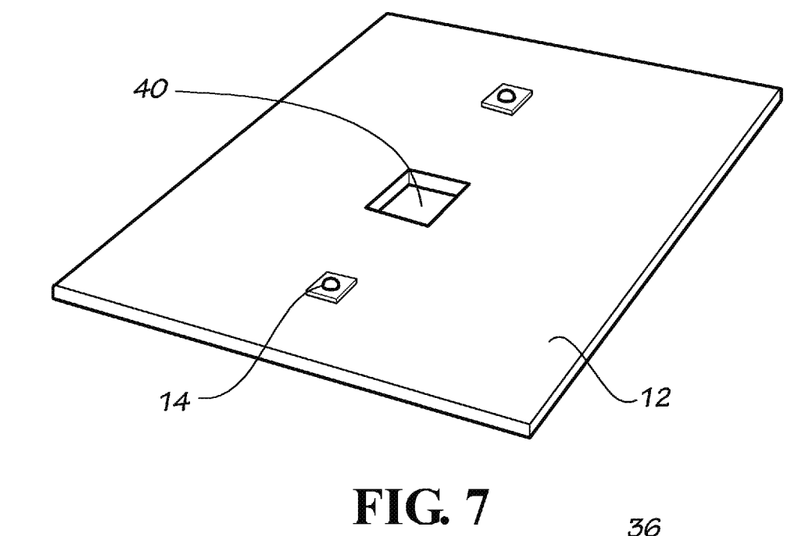
FIG. 7 is top perspective view of an embodiment of a PCB.

In some embodiments, openings or apertures 40 extend either partially or entirely through the PCB 12 (see FIG. 7) such that the optic 10 more specifically the outer optic 18) partially or entirely fills those openings or apertures 40 to create a strong mechanical interlock between the optic 10 and the PCB 12. See FIG. 8. Any number of openings or apertures 40 may be provided on the PCB 12 in any location. Moreover, the outer optic 18 material (such as certain types of silicone) may have thermally transmissive properties such that the outer optic 18 conducts heat generated on the PCB 12 to an underlying substrate (not shown).

Figure 8:
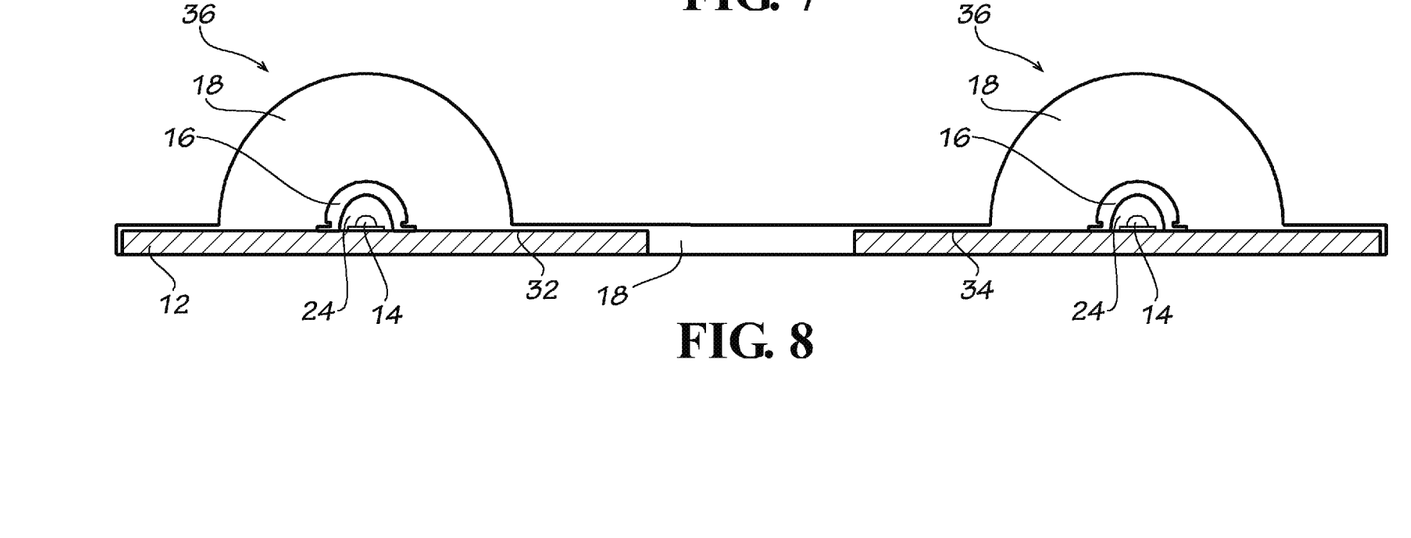
FIG. 8 is a cross-sectional view of another embodiment of an optic positioned on the PCB of FIG. 7.
Figure 9:
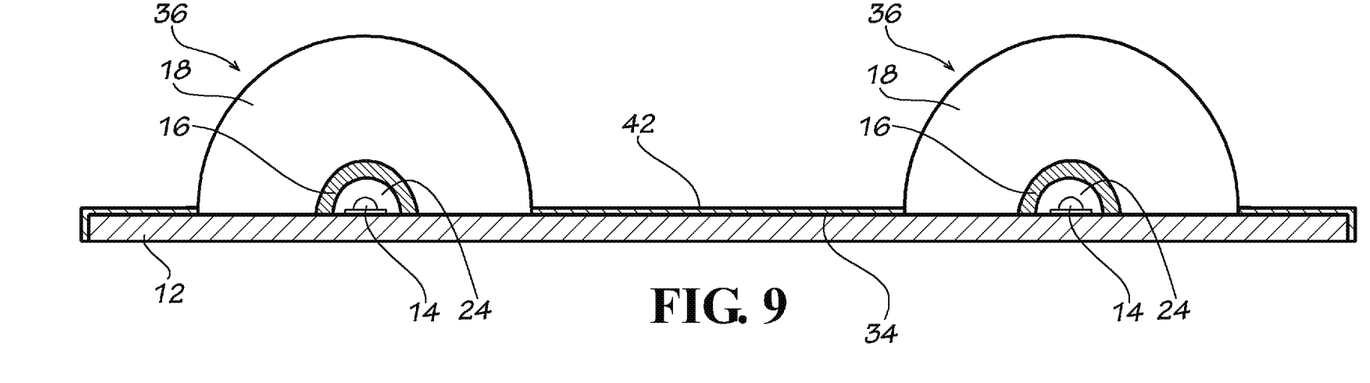
FIG. 9 is a cross-sectional view of yet another embodiment of an optic as well as a reflective surface coating positioned on a PCB.
Figure 10:
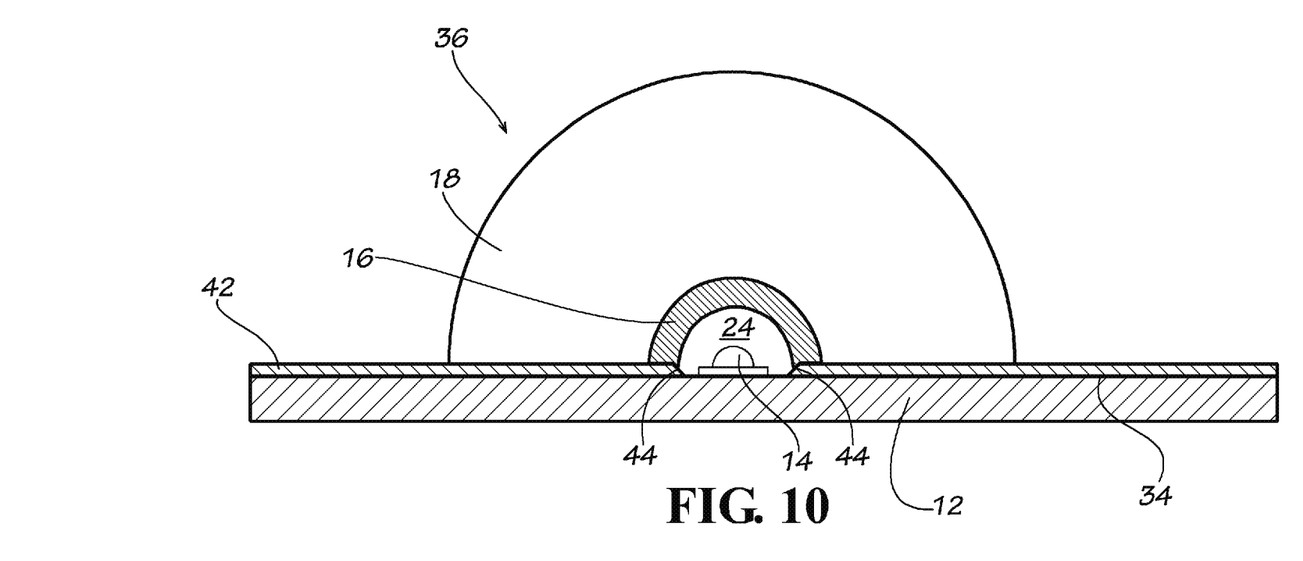
FIG. 10 is an isolated cross-sectional view of another embodiment of an optic as well as a reflective surface coating positioned on a PCB.
Figure 11:
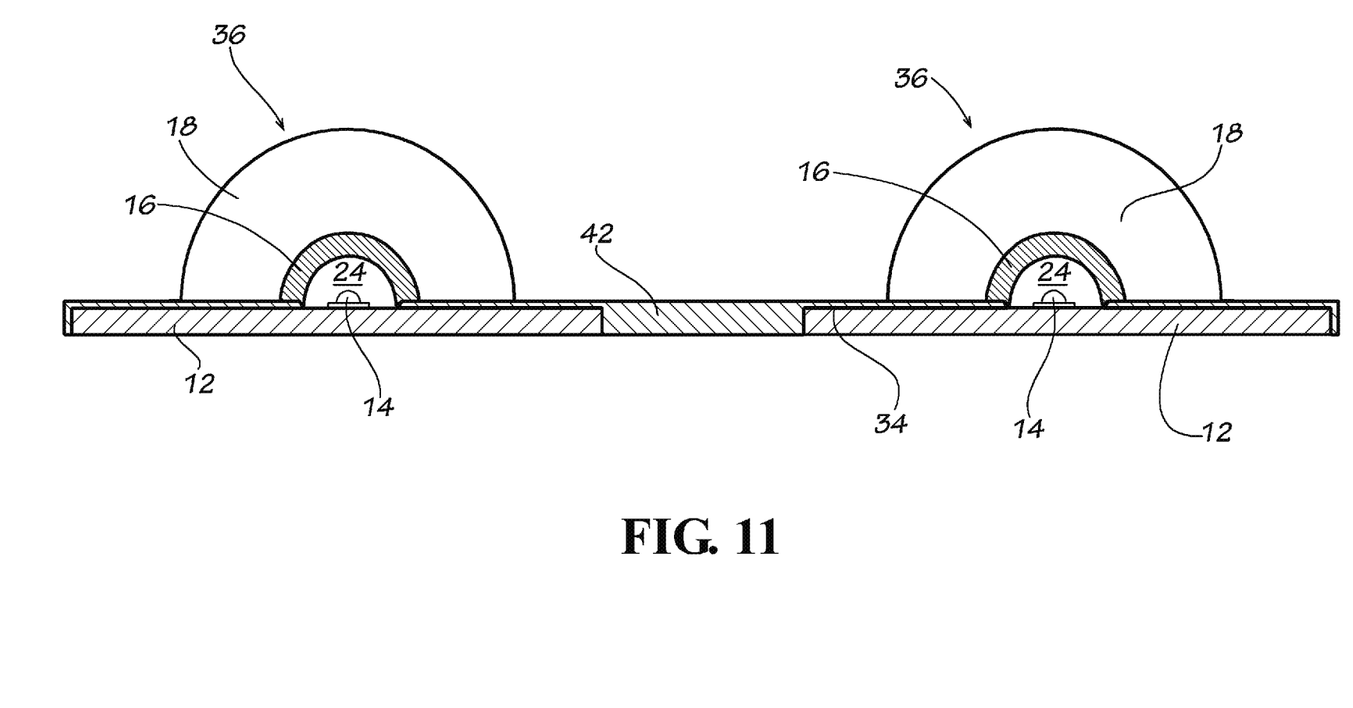
FIG. 11 is a cross-sectional view of yet another embodiment of an optic as well as a reflective surface coating positioned on the PCB of FIG. 7.

In another embodiment, a surface coating 42 of a highly reflective material (which in some embodiments is at least 90-100% reflective and in some embodiments is at least 98-100% reflective) is over-molded onto the upper surface 34 of the PCB 12 so as to conform to the upper surface 34 of the PCB 34. See FIGS. 9 and 10. In some embodiments, the highly reflective material is a silicone material. The surface coating 42 may cover any portion of the PCB upper surface 34. In some embodiments, the surface coating 42 is provided on the PCB 12 adjacent the LEDs 14, as shown in FIG. 10. The surface coating 42 may have angled sidewalls 44 adjacent the LEDs 14. An inner optic 16 may be positioned over the LED 14 (as described above) and then an outer optic 18 molded over the inner optic 16 (as described above) and optionally over a portion or all of the surface coating 42. The materials of the inner/outer optics 16, 18 may be the same or different, as described above. The angled sidewalls 44 of the reflective surface coating 42 help capture and reflect/redirect light emitted from an LED 14 approximately 90° off nadir back toward the inner optic 16, where it can be processed further by the inner optic 16 and outer optic 18. In embodiments where openings or apertures 40 are provided in the PCB 12, the reflective surface coating 42 (as opposed to the outer optic 18 as shown in FIG. 8) may fill such openings, as shown in FIG. 11.

In other embodiments, an outer optic 18 is not molded onto an inner optic 16 and the PCB 12. Rather, the entire optic 10 is pre-molded and then adhered to the PCB 12, such as with silicone or other adhesives.

Various types of silicone materials having the properties described herein are available from Dow Corning ("Dow"). For example, Dow's MS-1002 moldable silicone may be useful in certain applications. Moreover, Dow's moldable white reflector material may also be suitable, such as for use as surface coating 42. However, other sources for moldable silicone materials are known by those skilled in the art.

The foregoing is provided for purposes of illustrating, explaining, and describing embodiments of the present invention. Further modifications and adaptations to these embodiments will be apparent to those skilled in the art and may be made without departing from the scope or spirit of the invention. Different arrangements of the components depicted in the drawings or described above, as well as components and steps not shown or described are possible. Similarly, some features and subcombinations are useful and may be employed without reference to other features and subcombinations. Embodiments of the invention have been described for illustrative and not restrictive purposes, and alternative embodiments will become apparent to readers of this patent. Accordingly, the present invention is not limited to the embodiments described above or depicted in the drawings, and various embodiments and modifications can be made without departing from the scope of the invention.

We claim:

1. A method of providing an optic on a circuit board having an upper surface populated with at least one light emitting diode, the method comprising:

providing a pre-formed inner optic;

positioning the pre-formed inner optic having an inner surface and outer surface on the upper surface of the circuit board and over the at least one light emitting diode such that an air gap exists between the inner surface of the pre-formed inner optic and the at least one light emitting diode;

then molding an outer optic having an inner surface over the outer surface of the pre-formed inner optic; and molding the outer optic to engage an interlocking feature of the pre-formed inner optic such that the interlocking feature mechanically interlocks the inner and outer optic, wherein:

the outer surface of the pre-formed inner optic directly contacts the inner surface of the outer optic such that no gap exists between the pre-formed inner optic and the outer optic; and the pre-formed inner optic and the outer optic comprise material having identical optical properties.

2. The method of claim 1, wherein the pre-formed inner optic and the outer optic comprise silicone.

3. The method of claim 1, wherein the interlocking feature of the pre-formed inner optic comprises a groove.

4. The method of claim 1, wherein the circuit board comprises a thickness and an opening extending at least partially through the thickness of the circuit board and wherein the method further comprises molding the outer optic within the opening.

5. The method of claim 4, wherein the opening extends entirely through the thickness of the circuit board and wherein the method further comprises molding the outer optic within the opening and entirely through the thickness of the circuit board.

6. The method of claim 1, wherein the outer optic extends beyond the pre-formed inner optic and covers at least a portion of the upper surface of the circuit board.

7. The method of claim 1, wherein the outer optic covers the entire upper surface of the circuit board.

8. The method of claim 1, further comprising:
bending light emitted from the at least one light emitting diode as the light passes through the pre-formed inner optic; and
bending light emitted from the at least one light emitting diode as the light passes through the outer optic.

9. The method of claim 8, wherein the bending operation of the pre-formed inner optic is different than the bending operation of the outer optic.

10. The method of claim 1, wherein molding the outer optic comprises molding the outer optic over the entire outer surface of the pre-formed inner optic such that the entire outer surface of the pre-formed inner optic directly contacts the inner surface of the outer optic.

11. A method of providing an optic on a circuit board having an upper surface populated with at least one light emitting diode, the method comprising:
providing a pre-formed inner optic;
positioning the pre-formed inner optic having an inner surface and outer surface on the upper surface of the circuit board and over the at least one light emitting diode such that an air gap exists between the inner surface of the pre-formed inner optic and the at least one light emitting diode;
then molding an outer optic having an inner surface over the outer surface of the pre-formed inner optic; and
molding the outer optic to engage an interlocking feature of the pre-formed inner optic, wherein:
the outer surface of the pre-formed inner optic directly contacts the inner surface of the outer optic such that no gap exists between the pre-formed inner optic and the outer optic; and
the circuit board comprises a thickness and an opening extending at least partially through the thickness of the circuit board and wherein the method further comprises molding the outer optic within the opening.

12. The method of claim 11, wherein the opening extends entirely through the thickness of the circuit board and wherein the method further comprises molding the outer optic within the opening and entirely through the thickness of the circuit board.

13. The method of claim 11, wherein the pre-formed inner optic and the outer optic comprise material having different optical properties.

14. The method of claim 11, wherein the pre-formed inner optic and the outer optic comprise silicone.

15. The method of claim 11, wherein the interlocking feature of the pre-formed inner optic comprises a groove.

16. The method of claim 11, wherein the outer optic extends beyond the pre-formed inner optic and covers at least a portion of the upper surface of the circuit board.

17. The method of claim 16, wherein the outer optic covers the entire upper surface of the circuit board.

18. The method of claim 11, wherein molding the outer optic comprises molding the outer optic over the entire outer surface of the pre-formed inner optic such that the entire outer surface of the pre-formed inner optic directly contacts the inner surface of the outer optic.

19. A method of providing an optic on a circuit board having an upper surface populated with at least one light emitting diode, the method comprising:
providing a pre-formed inner optic;
positioning the pre-formed inner optic having an inner surface and outer surface on the upper surface of the circuit board and over the at least one light emitting diode such that an air gap exists between the inner surface of the pre-formed inner optic and the at least one light emitting diode;
then molding at least one outer optic over the outer surface of the pre-formed inner optic, wherein:
the outer surface of the pre-formed inner optic directly contacts the at least one outer optic such that no gap exists between the pre-formed inner optic and the at least one outer optic; and
the at least one outer optic comprises an outer surface having a shape that is asymmetric relative to a plane that (i) extends through a center of the optic and (ii) is perpendicular to an interface between the optic and the circuit board.

20. The method of claim 19, wherein the pre-formed inner optic and the at least one outer optic comprise material having different optical properties.

21. The method of claim 19, wherein the at least one outer optic comprises:
a first outer optic disposed adjacent to the pre-formed inner optic and comprising the asymmetric outer surface having the asymmetric shape; and
a second outer optic comprising an inner surface that contacts the outer surface of the first outer optic.

22. The method of claim 19, wherein the shape of the asymmetric outer surface comprises a greater maximum offset from the circuit board on a first side of the plane compared to a maximum offset from the circuit board on a second side of the plane.

* * * * *